March 18, 1969 J. C. MARINACE 3,433,686

PROCESS OF BONDING CHIPS IN A SUBSTRATE RECESS BY EPITAXIAL GROWTH OF THE BONDING MATERIAL

Filed Jan. 6, 1966

INVENTOR
JOHN C. MARINACE

BY S. P. Tedesco

ATTORNEY

United States Patent Office 3,433,686

Patented Mar. 18, 1969

3,433,686

PROCESS OF BONDING CHIPS IN A SUBSTRATE RECESS BY EPITAXIAL GROWTH OF THE BONDING MATERIAL

John C. Marinace, Yorktown Heights, N.Y., assignor to International Business Machines Corporation, Armonk, N.Y., a corporation of New York Filed Jan. 6, 1966, Ser. No. 519,075
U.S. Cl. 148—175 17 Claims
Int. Cl. H01l 7/40, 3/00

ABSTRACT OF THE DISCLOSURE

Planar substrate assemblies are formed in a substrate having a plurality of recesses into each of which one device chip is placed. The substrate is, for example, formed of an insulating material such as sapphire, and the device chips of a semiconductor material such as germanium. The chips are bonded to the substrate by epitaxially growing germanium in the spaces in the recesses between the chips and the sapphire. In this way a monocrystalline bond is formed between the chips and the substrate. The assembly is then subjected to appropriate polishing to obtain a planar surface which is suitable for further processing.

This invention relates to solid-state electronic devices and, more particularly, to the preparation of a planar substrate assembly having discrete device areas, for example, formed in chip fashion, each capable of defining one or more solid-state electronic devices and embedded within a supporting substrate. In its broader aspects, the present invention is directed to the bonding by material-growth processes of discrete chips of selected materials, e.g., semiconductive, ferrite, etc., within a supporting substrate of same or different material, the discrete chips being supported either in insulated or non-insulated fashion. In the preferred practice of this invention, the discrete chips defining device areas and/or the supporting substrate are formed of a material selected to "seed" the material-growth process.

At the present time, industry is developing an integrated circuit technology whereby large numbers of solid-state electronic devices are formed on a same supporting substrate and functionally interconnected. The supporting substrate can be formed either of semiconductor material so as to form an integral part of such electronic devices or, alternatively, such substrate can be formed of insulating material, e.g., intrinsic or semi-insulating semiconductor material. For many applications, supporting substrates formed of insulating materials are desirable in that electrical isolation is inherently provided between the electronic devices supported thereon. When the supporting substrate is formed of conductive material, isolation between electronic devices is achieved, for example, by forming thin insulating layers in pocket-fashion about discrete device areas or the utilization of reverse-biased PN junctions formed between such areas and the supporting substrate. When isolation between the device areas is not desired, such isolation techniques are not employed.

More recently, discrete solid-state electronic devices have been formed within a supporting substrate of insulating material by epitaxial processes, for example, as described in the J. C. Marinace Patent 3,133,336, issued on May 19, 1964 and assigned to a common assignee. As therein disclosed, a plurality of same-type semiconductor junction devices are concurrently formed by vapor-growth processes within device-containing openings defined within a supporting substrate of refractory material. As described, the process is of relatively long duration since each junction device is totally formed by vapor-deposited material; moreover, the achievement of required doping levels in successive layers of the junction devices are often difficult to obtain.

In the present development of the art, elaborate processes have been practiced to define discrete device areas within a suporting substrate. However, such processes are limited since the device areas are generally formed of a same-type semiconductive material or comprise same-type electronic devices. The requirements of industry in this regard are best satisfied by a process which is easily practiced and whereby device areas of same or dfferent type semiconductive materials are rapidly defined in the supporting substrate to achieve a planar substrate assembly.

An object of this invention is to provide a planar substrate assembly defining a plurality of discrete device areas.

Another object of this invention is to provide an improved method of forming a planar substrate assembly wherein device areas are formed either of a same or different type semiconductive material.

Another object of this invention is to provide a novel method of bonding, or cementing, two bodies of a same or different type material by material-growth processes.

Another object of this invention is to provide a novel method for defining a particular pattern of insulated device areas in a planar substrate assembly.

Another object of this invention is to provide a novel method of forming a substantially linear junction in a solid-state electronic device which is substantially perpendicular to the plane of a major surface of a supporting substrate.

Another object of this invention is to form a particular pattern of device areas on both major surfaces of a supporting substrate.

Another object of this invention is to form a particular pattern of electrical connections between major surfaces of a supporting substrate.

These and other objects and features are obtained by bonding discrete device areas, formed either of a same or different type material, in recessed-fashion within a substrate structure of selected material, a vapor-grown material being utilized as the bonding agent. In accordance with the particular aspects of this invention, the device areas defined as discrete chips and/or the supporting substrate serve to "seed" the vapor-grown material which deposits epitaxially so as to form a strong crystallographic bond therebetween. The particular vapor-growth process is only incidental to the practice of this invention and numerous processes, for example, as described in J. C. Marinace et al. Patent 3,014,820, issued on Dec. 29, 1961 and assigned to a common assignee, J. C. Marinace Patent 3,065,116, issued on Nov. 20, 1962 and assigned to a common assignee and J. C. Marinace Patent 3,089,794, issued on May 14, 1963 and assigned to a common assignee, may be advantageously employed, to effect a crystallographic bond. Also, numerous other material transport processes can be employed in the practice of this invention, e.g., solution growth, electro-plating, etc.; however, vapor-growth processes are preferred since they are not limited by surface tensions of liquids.

In accordance with the more particular aspects of this invention, a plurality of device-containing recesses are defined in a supporting substrate of selected insulating material, e.g., calcium fluoride, sapphire, etc., each dimensioned to receive at least one device chip of particular material, e.g., semiconductive, ferrite, etc. When the supporting substrate is formed of conductive material, e.g., metallic, semiconductive, etc., a thin insulating layer of appropriate material is provided within the device-containing recesses to electrically isolate the device chips. However, if electrical isolation of the device chips is not desired, the thin insulating film is not used. Since the supporting substrate and/or the device chips "seed" the vapor-deposited bonding material, a strong bonding of the device chips within the supporting substrate is achieved. Also, constituent materials forming the device chips and the supporting substrate are selected to have compatible coefficients of linear expansion such that the substrate material shrinks slightly around the device chips following the vapor-growth step. Subsequent to the bonding process, the substrate assembly is subjected to appropriate polishing techniques, e.g., mechanical lapping, chemical polishing, etc., to obtain a planar surface suitable for further processing. Maximum flexibility in the preparation of substrate assemblies for integrated circuits is achieved since the individual device chips can be formed of different selected materials or a same material exhibiting different conduction characteristics whereby complementary type solid-state electric devices are easily achieved in the final assembly.

The foregoing and other objects, features, and advantages of the invention will be apparent from the following more particular description of preferred embodiments of the invention, as illustrated in the accompanying drawings.

The present invention is particularly characterized by the bonding of device chips of a first material within a preformed substrate of second material by vapor-grown material. In the description hereinafter set forth, such device chips are formed of semiconductive material, either as blanks suitable for the subsequent fabrication of solid-state electronic devices or as containing one or more devices. The vapor-grown bonding material is broadly described as one susceptible to vapor-growth, e.g., elemental or compound semiconductive materials, a broad class of metallic materials, etc., and may be of a same material as the device chips and/or substrate. In the preferred practice of this invention, three requirements are made: (1) that the vapor-grown bonding material is epitaxially compatible with the device chip and/or the substrate materials to form a crystallographic bond therewith; (2) the respective linear coefficients of expansion of the device chip material and the substrate material are compatible such that the device chips are retained under slight compression; and, (3) the vapor-grown bonding material does not "poison" or affect the electrical properties of the device chip and substrate materials. It should be evident, however, that such requirements are not intended to limit the scope of this invention. For example, vapor-grown bonding material need not form a crystallographic bond with either the device chips or substrate but, rather, can be deposited in non-epitaxial fashion to achieve the objects of this invention. Also, numerous processes other than that to be detailed can be practiced to deposit the bonding material, e.g., vapor deposition, sputtering, solution growth, etc. and are intended by this invention.

Figure 1:
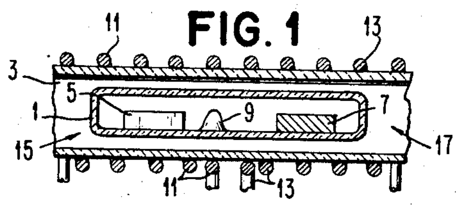
FIG. 1 is a cross-sectional view of an apparatus suitable for vapor-growing the bonding material in accordance with this invention.

In the preferred practice of this invention, the bonding material is epitaxially deposited which may be defined as the addition of a material to a "seeding" surface which exhibits a same atomic periodicity and crystal structure as the "seeding" surface. An epitaxial deposition can be effected by a disproportionation reaction process whereby a halide compound of a material is continuously formed and locally decomposed to deposit onto a substrate surface. For example, as shown in FIG. 1, a "closed tube" system for effecting such deposition comprises a sealed tube 1 positioned within a furnace 3 and containing a source 5 of bonding material, intrinsic germanium, a substrate 7 and a halide carrier source 9, e.g., iodine. Source 5 and substrate 7 are placed at opposite ends of sealed tube 1 which is located within coils 11 and 13; when energized, coils 11 and 13 establish a temperature gradient along sealed tube 1 to support a disproportionation reaction process. Coil 11 elevates the temperature at the source end 15 of sealed tube 1 to, say 550° C., to vaporize both source 5 and, also, halide source 9, such vapors combining to form germanium iodides ($GeI_4$ and $GeI_2$) which diffuse throughout sealed tube 1. On the other hand, coil 13 maintains the temperature at the substrate end 17 of sealed tube 1 at a lower temperature, say 400° C., to support decomposition of the germanium iodides and yield free germanium which deposits onto substrate 7. The disproportionation reaction process for germanium is reversible and can be given by the equation $$2GeI_2 \rightleftarrows Ge\downarrow + GeI_4$$

As the temperature decreases, the reaction proceeds to the right whereby decomposition is achieved. Under such conditions, the intrinsic germanium deposits out over the surface of substrate 7, and is advantageously employed as the bonding agent to achieve the substrate assemblies and structures as in FIGS. 2 through 5. While the $Ge-I_2$ system has been described, it is evident that numerous other materials suitable as bonding agents may be similarly deposited.

Figure 2A:
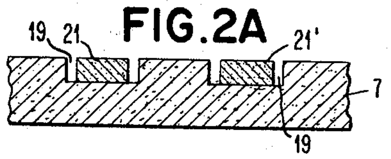
FIGS. 2 through 5 illustrate various substrate assemblies and structures obtainable by the practice of this invention.

Referring to FIG. 2A, substrate 7 is preformed to define a particular pattern of device-containing recesses 19 on one major surface thereof for receiving device chips 21 and 21'. Recesses 19 are defined in substrate 7 by conventional techniques, e.g., ultra-sonic cutting, chemical etching, etc., and are of a same geometry as device chips 21 and 21', the spacing therebetween being minimal, e.g., in the order of 0.001 inch to 0.003 inch, to reduce processing time. For purposes of description, substrate 7 is formed of a single-crystal insulating material, e.g., semi-insulating gallium arsenide, silicon, germanium, sapphire, calcium fluoride, etc., to "seed" the epitaxial deposition of the germanium bonding material. Alternatively, substrate 7 can be formed of an amorphous insulating material, e.g., alumina glass, Pyroceram (trademark of Corning Glass Works), etc.; in such event, device chips 21 and 21' are formed of semiconductive material of particular conductivity type to "seed" the germanium bonding material. Also, the substrate 7 can be formed of a sintered ceramic material such as alumina, beryllia, aluminum nitride, etc.

For purposes of description, substrate 7 of FIG. 2A is formed of calcium fluoride and device chips 21 and 21' are formed of gallium arsenide and germanium, respectively, of either a same or different type conductivity. When device chips 21 and 21' have been positioned in recesses 19, substrate 7 is placed in tube 1 which is sealed and positioned in furnace 3. It is known, that the lattice spacing or periodicity of calcium fluoride corresponds closely to that of monocrystalline germanium. Accordingly, when coils 11 and 13 are energized to support the germanium disproportionation reaction process, free germanium deposits out onto the exposed surfaces of substrate 7 and device chips 21 and 21' and into the spacings therebetween, as indicated by the bonding layer 23 of FIG. 2B. Bonding layer 23 forms in epitaxial fashion over the exposed surfaces of calcium fluoride substrate 7 and, also, device chip 21 so as to define therewith crystallographic bonds. Additionally, substrate 7 preferably exhibits a linear coefficient of expansion compatible, e.g., slightly greater than, that forming device chips 21 and 21'. Accordingly, portions of bonding layer 23 formed between substrate 7 and device chips 21 and 21' are subsequently compressed to more firmly secure device chips 21 and 21' within substrate 7.

Figure 2B:
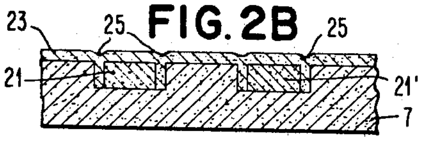
Figure 2C:
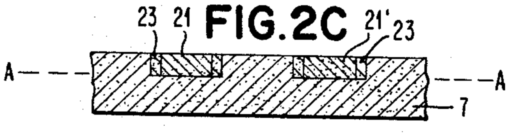
Figure 2D:
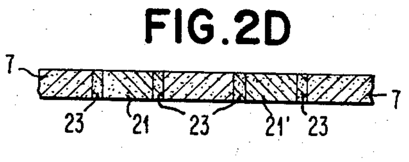

As shown in FIG. 2B, the surface of bonding layer 23 is not planar but, rather, contains depressions 25; also the upper surfaces of device chips 21 and 21' are not accessible for processing. In the preferred method, the deposition process is continued to locate the bottom of depressions 25 at least above the plane of the major surface of substrate 7. Subsequently, the structure of FIG. 2B is subjected to mechanical-lapping to remove portions of bonding layer 23 from over the surfaces of device chips 21 and 21′ as shown in FIG. 2C. For many purposes, however, mechanical-lapping does not properly form the surfaces of device chips 21 and 21′, for example, for the diffusion of bipolar transistor structures. Accordingly, the structure of FIG. 2C may be chemically etched, as well known in the art, to properly form the surfaces, at least, of device chips 21 and 21′. If desired, chemical etching can be continued until the surfaces of device chips 21 and 21′ are below the plane of the major surface of substrate 7 to facilitate certain kinds of device fabrication. For example, semiconductor material of opposite conductivity type can be grown over the reduced surfaces of device chips 21 and 21′ to define a junction device therewith, the resulting junction being parallel to the major surface of substrate 7. The resulting substrate assembly of FIG. 2C exhibits a planar topology and comprises a number of discrete device chips 21 and 21′ embedded in spaced-insulated fashion within substrate 7. Further, the structure of FIG. 2C can be further modified by "lapping off" the opposite major surface along the dashed line A—A to achieve the structure of FIG. 2D wherein device chips 21 and 21′ extend through substrate 7. By forming device chips 21 and 21′ to have an internal, or buried, intrinsic region, i.e., as p-i-p, n-i-n, or n-i-p structures, each of the oppositely-exposed surfaces of such chips can be utilized for fabrication, e.g., by diffusion, of solid-state electronic devices. Since substrate 7 is formed of insulative material, device chips 21 and 21′ and electronic devices formed therein can be interconnected by metalization patterns formed by conventional techniques directly over exposed surfaces of substrate 7.

Figure 3A:
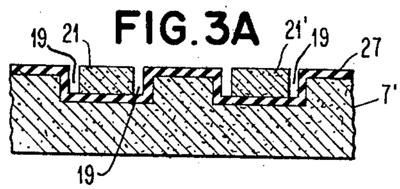
Figure 3B:
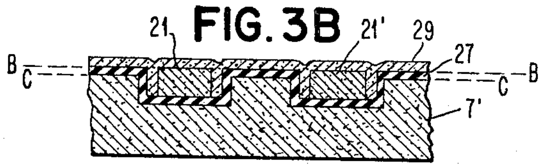
Figure 3C:
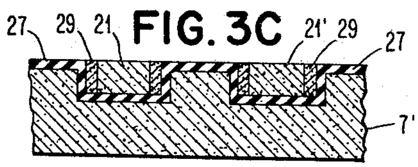
Figure 3D:
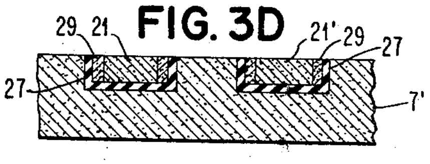

An alternative substrate assembly obtainable by the practice of this invention is shown in FIGS. 3C and 3D and is distinguishable in that substrate 7′ is formed of a conductive material, e.g., molybdenum, tungsten, nickel, etc. or a semiconductive material of particular-type, e.g., silicon, germanium, gallium arsenide, etc. To electrically isolate device chips 21 and 21′ in the final substrate assembly, thin insulating layer 27 of selective material is initially formed over the surface of substrate 7 and within recesses 19 as shown in FIG. 2A. For example, if substrate 7 is formed of metal, insulating layer 27 can be formed of alumina. Alternatively, if substrate 7 is formed of a semiconductive material, e.g., silicon, insulating layer 27 may be formed of silicon dioxide obtained by heating substrate 7′ in an oxidizing atmosphere, as well known in the art. Device chips 21 and 21′ preferably "seed" the vapor-grown bonding material. Again, the structure of FIG. 3A is positioned in tube 1 which is then sealed and placed in furnace 3. When coils 11 and 13 are energized, intrinsic germanium deposits out over insulating layer 27 and device chips 21 and 21′ to form bonding layer 29 as shown in FIG. 3B. To provide a planar surface, the structure of FIG. 3B is mechanically-lapped to line B—B and then chemically etched to properly form the surfaces of device chips 21 and 21′ whereby the substrate assembly in FIG. 3C is obtained. Solid-state electronic devices can, therefore, be fabricated on the exposed surfaces of device chips 21 and 21′. Alternatively, when substrate 7′ is formed of semiconductive material, the mechanical lapping process can be continued to the dashed line C—C to obtain the substrate assembly illustrated in FIG. 3D whereby selected surface portions of semiconductor substrate 7′ are also available for the diffusion of devices.

Figure 4A:
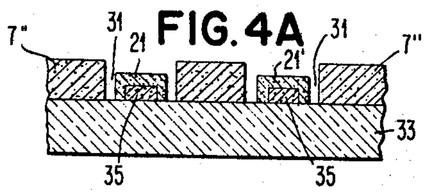
Figure 4B:
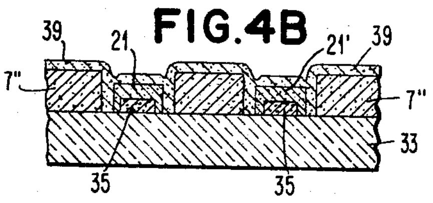
Figure 4C:
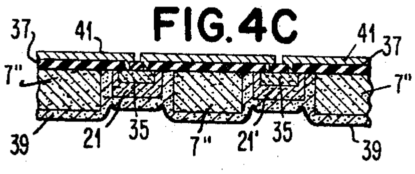

A planar substrate assembly without the need for mechanical-lapping by the method described with respect to FIGS. 4A through 4C. Referring to FIG. 4A, substrate 7″ is formed of an insulating material, e.g., sapphire, and provide a pattern of thru-holes 31. Substrate 7″ is positioned on a glassy quartz plate 33 which has a substantially perfect planar surface. Device chips 21 and 21′, e.g., formed of silicon, are placed in thru-holes 31 and rest upon quartz plate 33. For purposes of description, device chips 21 and 21′ are illustrated as including circuit arrangements 35 of one or more devices. The structure of FIG. 4A is inserted into tube 1 containing a source 5, e.g., of intrinsic silicon, tube 1 being sealed and coils 11 and 13 energized to support a Si-$I_2$ disproportionation reaction process. As shown in FIG. 4B, the deposited source material forms bonding layer 39 which is crystallographically bonded, at least, to substrate 7″ and to device chips 21 and 21′; however, bonding layer 39 exhibits relatively poor adhesion to the quartz plate 33. When bonding layer 39 has been deposited, quartz substrate 31 is removed whereby the substrate assembly of FIG. 4C is obtained having a planar topology. Conventional techniques can be employed to interconnect circuit arrangements 35 in device chips 21 and 21′. For example, a thin insulating layer 37 of silicon dioxide can be pyrolytically formed over the substrate assembly, e.g., by thermally decomposing tetraethylorthosilicate at 725° C. Subsequently, windows are opened in insulating layer 37 and thin film connections 41 are defined between circuit arrangements 35 in device chips 21 and 21′, respectively, by conventional photoresist techniques.

Figure 5A:
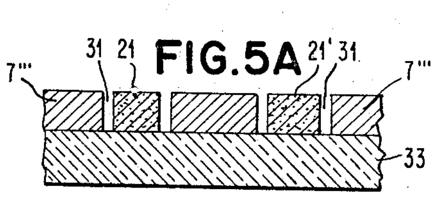
Figure 5B:
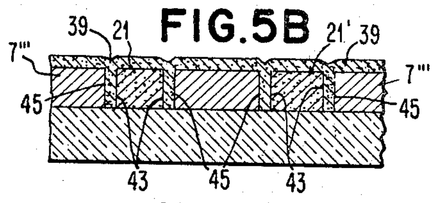
Figure 5C:
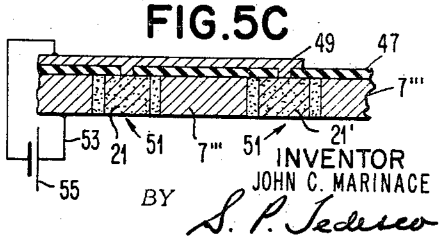

An additional structure obtainable by the practice of this invention is described with respect to FIGS. 5A through 5C and is distinguishable in that the bonding material forms a PN junction with the constituent material of device chips 21 and 21′ and, hence, an integral part of solid-state electronic devices. For example, an electroluminescent diode matrix is achieved by forming substrate 7‴ of a conductive material. The vapor-grown bonding material is selected to define a substantially ohmic contact with substrate 7‴ and a PN junction with the device chip material. As illustrated in FIG. 5A, substrate 7‴, e.g., of molybdenum, is positioned onto quartz substrate 33 and device inserts 21 and 21′, e.g., both of N-type gallium arsenide, are positioned in thru-holes 31. The structure of FIG. 5A is positioned in tube 1 of FIG. 1 which is sealed so as to contain an acceptor-type impurity material, e.g., zinc. For example, source 5 may be formed of gallium arsenide suitably doped with zinc or, alternatively, elemental zinc, the presence of the zinc supporting an independent disproportionation reaction process with halide source 9 when coils 11 and 13 are energized. The Zn-$I_2$ and GaAs-$I_2$ disproportionation reactions are supported concurrently and the resulting bonding layer 39 exhibits a controllable P-type conductivity. P-type bonding layer 39 forms a PN junction 43 with each of the device chips 21 and 21′ to define the anodes and cathodes, respectively, of the electroluminescent diodes 51 and, also, ohmic contacts 45 with substrate 7‴ as shown in FIG. 5B. It is to be noted that PN junction 43 is substantially perpendicular to the major surface of substrate 7‴. As shown in FIG. 5C, the bonded structure is removed from quartz plate 33 and mechanically-lapped so as to remove excess P-type bonding material and expose terminals of PN junctions 43. As known, P-type semiconductive material is highly light-absorbent and exposure of the PN-junction terminals increases the efficiency of the diode structure. A thin insulating layer 47, e.g., of pyrolytic silicon dioxide, is formed by conventional processes over at least one major surface of the bonded structure as shown in FIG. 5C and a thin film metalization 49 is conventionally formed to each of the device chips 21 and 21′ defining a common cathode connection of electroluminescent diodes 51 to voltage source 55; in addition, a common anode connection is made by connecting substrate 7‴ along ohmic contact 53 to voltage source 55.

It is evident that numerous other structures are suggested to those skilled in the art from the description hereinabove set forth. For example, the above-described technique may be employed to provide electrical thru-connections between opposite major surfaces of a substrate assembly. Referring again to FIGS. 5A through 5C, chips 21 and 21' can be formed of metal, e.g., tungsten, and bonded, as described, within substrate 7''' formed either of high-resistivity semiconductive or insulative material to effectively isolate the thru-connections. Alternatively, a thin insulating layer, for example, such as layer 37 of FIG. 4C, can be pyrolytically formed over substrate 7''' to insure such isolation. Bonding layer 39 can be formed of an appropriate vapor-grown material, e.g., insulative (intrinsic semiconductive material), or conductive (metallic, e.g., tungsten), or semiconductive material to achieve a strong bonding of chips 21 and 21' within substrate 7'''.

While the invention has been particularly shown and described with reference to preferred embodiments thereof, it will be understood by those skilled in the art that various changes in form and details may be made therein without departing from the spirit and scope of the invention.

What is claimed is:

1. A method for forming a substrate assembly comprising the steps of preforming a supporting substrate to define at least one recess in a surface thereof, positioning a discrete chip of selected material within said recess, said recess and said chip being dimensioned to define a spacing between respective surfaces thereof and exposed at said surface, and depositing a bonding material by an epitaxial-growth process within said spacing, said bonding material depositing over and adhering to each of said respective surfaces to bond said chip within said substrate said bonding material forming an epitaxial monocrystalline bond with the surface of at least one of said chips and said recess surface.

2. The method of claim 1 comprising the further step of forming said supporting substrate structure and said chip of selected materials exhibiting compatible coefficients of linear expansion.

3. The method of claim 1 including the further step of providing a thin insulating layer over the surface of said substrate and, at least, within said recess whereby said chip is electrically isolated from said substrate.

4. The method of claim 1 including the further step of forming said chip of a semiconductor material of first conductivity type, said bonding material being constituted of a semiconductor material of opposite conductivity type to define a PN junction with said chip.

5. The method of claim 1 including the further steps of depositing said bonding material by said epitaxial-growth process over said surface of said substrate so as to deposit over said chip and also within said spacing, and polishing the resultant structure to expose a surface of said chip as bonded within said substrate.

6. The method of claim 3 including the further step of forming at least one solid-state electronic device in said chip.

7. A method for forming a substrate assembly comprising the steps of preforming a supporting substrate to define a pattern of chip-receiving recesses in one surface thereof, positioning a plurality of discrete chips of selected material each within a corresponding one of said recesses, corresponding ones of said recesses and said chips being dimensioned to define a spacing between opposing surfaces thereof and exposed at said one surface of said substrate, depositing a selected material by an epitaxial-growth process over said one surface of said substrate and over said chips and within said spacings, said selected material when deposited within said spacings being effective to bond said chips within corresponding ones of said recesses so as to define an integral structure, said bonding material forming in each recess an epitaxial monocrystalline bond with the surface of at least one of said chips and said recess surface, and polishing said integral structure at a first surface to expose first surfaces of said chips as bonded within said substrate.

8. The method of claim 7 including the further step of initially forming a thin insulating layer within selected ones of said recesses whereby corresponding ones of said chips are bonded within said substrate in spaced-insulated fashion.

9. The method of claim 7 comprising the further step of forming said chips of different semiconductor materials.

10. The method of claim 7 comprising the further step of forming said discrete chips of semiconductive materials of different conductivity types.

11. The method of claim 7 comprising the further step of forming said substrate of a semi-insulating semiconductive material and each of said chips of a semiconductive material of selected conductivity type.

12. The method of claim 7 comprising the further step of forming said substrate of an insulative material and said chips of selected semiconductive materials, said semiconductive materials being effective to "seed" said epitaxial-growth process whereby a monocrystalline bond is formed between said chips and said bonding material.

13. The method of claim 7 comprising the further step of forming said substrate of an insulative material and said chips of selected semiconductive materials, said insulative material being effective to "seed" said epitaxial-growth whereby a monocrystalline bond is formed between said substrate and said bonding material.

14. The method of claim 7 including the further step of depositing said selected material by a disproportionation reaction process.

15. The method of claim 7 wherein said polishing step includes polishing said integral structure at an opposite surface to expose second surfaces of said chips as bonded within said substrate at said opposite surface.

16. The method of claim 15 including the further step of forming selected ones of said chips of semiconductor material and having an interior intrinsic region parallel to said first and second surfaces whereby each of said exposed first and second surfaces of said chips can be utilized individually for device fabrication.

17. The method of claim 15 comprising the further step of forming selected ones of said chips of a metallic material to provide conductive paths between said first and said opposite surfaces of said integral structure.

References Cited

UNITED STATES PATENTS

| | | | |
|---|---|---|---|
| 3,150,299 | 9/1964 | Noyce | 148—1.5 XR |
| 3,300,832 | 1/1967 | Cave | 29—588 XR |
| 3,312,879 | 4/1967 | Godejahn | 317—234 |
| 3,316,128 | 4/1967 | Osafune et al. | 148—175 XR |
| 3,320,485 | 5/1967 | Buie | 317—101 |
| 3,322,581 | 5/1967 | Hendrickson et al. | 148—175 |
| 3,325,882 | 6/1967 | Chiou et al. | 317—101 XR |
| 3,332,137 | 7/1967 | Kenney | 29—580 XR |
| 3,372,070 | 3/1968 | Zuk | 148—175 XR |
| 3,381,182 | 4/1968 | Thornton | 317—235 XR |
| 3,383,760 | 5/1968 | Shwartzman | 29—577 |

L. DEWAYNE RUTLEDGE, *Primary Examiner.*

P. WEINSTEIN, *Assistant Examiner.*

U.S. Cl. X.R.

148—115, 174, 172, 33; 29—577, 578, 589, 588; 117—106, 201, 212; 317—101, 234, 235; 156—17